United States Patent [19]

McMurray, Jr.

[11] Patent Number: 4,833,397

[45] Date of Patent: May 23, 1989

[54] TESTER FOR VERIFICATION OF PULSE WIDTHS IN A DIGITAL SYSTEM

[75] Inventor: Frank McMurray, Jr., Walnut, Calif.

[73] Assignee: Unisys Corporation, Blue Bell, Pa.

[21] Appl. No.: 34,242

[22] Filed: Apr. 6, 1987

[51] Int. Cl.$^4$ ............................................. G01R 31/28
[52] U.S. Cl. ...................................... 324/73 R; 371/1
[58] Field of Search ............ 324/73 R, 73 AT, 158 R; 371/25, 1

[56] References Cited

U.S. PATENT DOCUMENTS

| | | | |
|---|---|---|---|
| 4,542,505 | 9/1985 | Binoeder et al. | 371/1 |
| 4,574,354 | 3/1986 | Mihalik et al. | 324/73 R |
| 4,577,318 | 3/1986 | Whitacre et al. | 324/73 R |
| 4,620,302 | 10/1986 | Binoeder et al. | 371/1 |
| 4,628,253 | 12/1986 | Yu et al. | 324/73 R |

Primary Examiner—Ernest F. Karlsen
Attorney, Agent, or Firm—Alfred W. Kozak; Nathan Cass; Kenneth L. Miller

[57] ABSTRACT

A tester-verifier apparatus operates to select a single one of a plurality of system clocks to verify that the clock width falls between accepted parameters. Secondarily, the apparatus selects representative clock signals for comparison with a reference clock to verify that the skew falls within accepted parameters. Additionally the apparatus can measure the exact time value of any pulse width or skew relationship to within 500 picoseconds ($10^{-12}$). Any selected system clock signal is split into two channels, one of which has a controlled delay time programmed by a microprocessor to develop minimum and maximum pulse parameters against which the selected clock signal is logically compared to see if the parameters are satisfied.

5 Claims, 2 Drawing Sheets

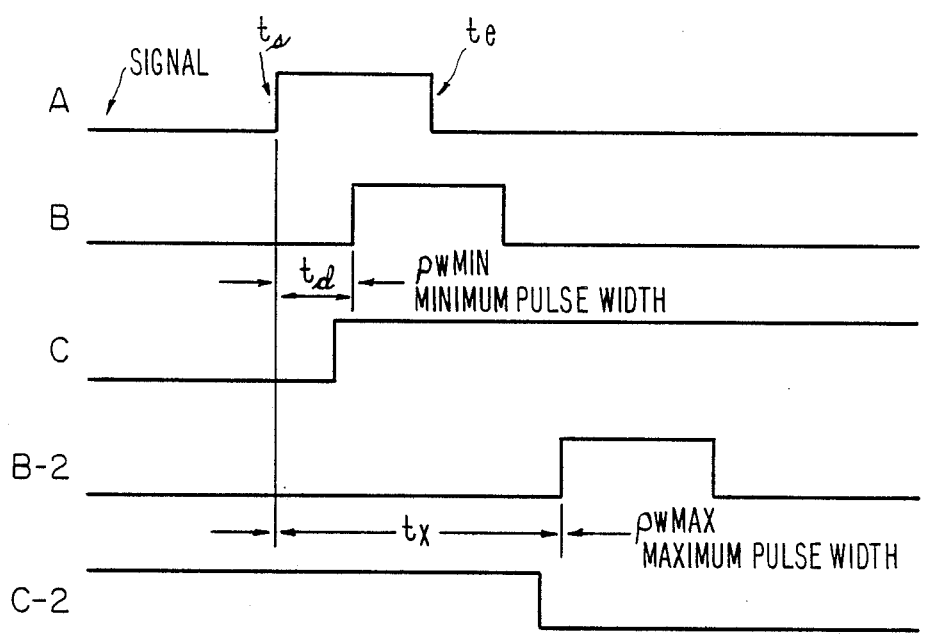
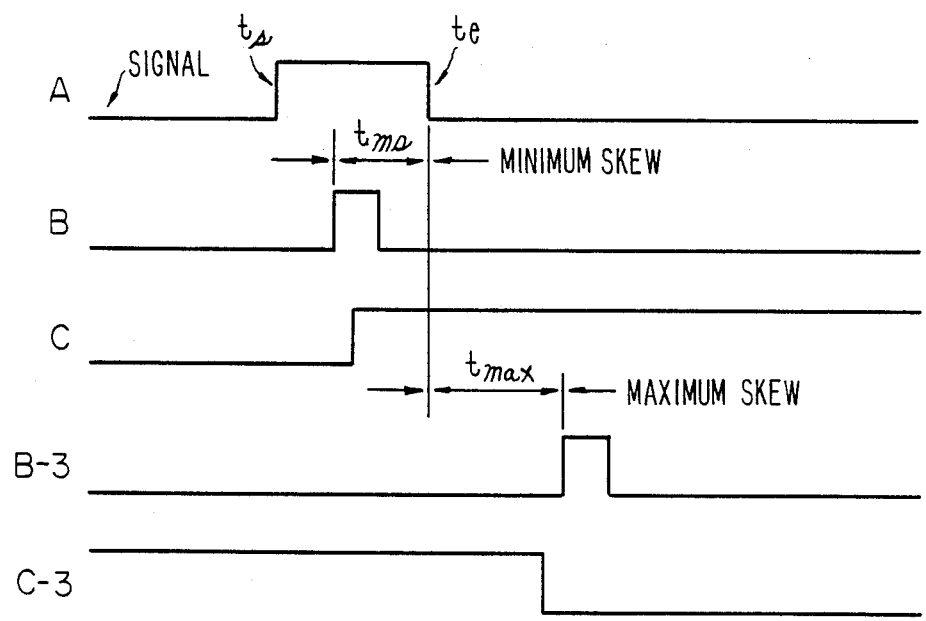

TESTER FOR VERIFICATION OF PULSE WIDTHS IN A DIGITAL SYSTEM

FIELD OF THE INVENTION

This disclosure refers to the testing of digital systems which use a variety of symmetrical and asymmetrical clocks having different frequencies, phase, and skew conditions.

CROSS-REFERENCES TO RELATED PATENTS

This disclosure is related to two patent applications involving the testing of digital signals. These patents are entitled "Programmable Digital Signal Testing System" which issued as U.S. Pat. No. 4,620,302 by inventors Peter P. Binoeder, James B. Whitacre, and Don Kunker; and the other patent was entitled "Adjustable System for Skew Comparison of Digital Signals" which issued as U.S. Pat. No. 4,542,505 by inventors Peter P. Binoeder and James B. Whitacre.

BACKGROUND OF THE INVENTION

Modern digital systems which include computers, controllers, memories, and other digital modules will often make use of a variety of clock signals. Some of these clock signals are of the symmetrical type where the positive phase and the negative phase are in balance, and some are of the asymmetrical type clocks where there is a considerable difference between the positive phase and the negative phase in terms of time involved. Additionally, these modern digital systems which use these different types of clocks will also have variations in their frequency, their phase relationship, and the skew characteristic.

Generally, testing personnel are interested in the length (time period) of the pulse width of a signal transition such as when the signal changes from 0–1 into a positive phase, (this may be designated as $t_s$) and when this particular pulse signal returns from 1–0, (this time period may be referred to as $t_e$). These designations may be used to refer to the start point as $t_s$ and the end point as $t_e$. Thus the pulse width would be defined as the period of time from the positive transition to the negative transition which would be the difference between the time moment $t_s$ and the time moment $t_e$.

In the situation of "skew" measurement, here the situation may be defined as a condition where two signals are being compared as to the occurrence of a change, which may be called a "signal event". Then it is desired to see whether the signal event being compared between the two signals is exactly at the same time moment or there is a difference in time occurrence between the two compared signal events. If there is a difference between the time occurrence of the same type event in the two signals, then this difference in time period is known as "skew".

Thus if two signals, signal A and signal B, are being compared for a "0–1 transition event", and the first signal A has this particular event occur at a time $t_0$ and the second signal B has the same event occur at time $t_1$, then the difference between the two times of $t_0$ and $t_1$ is the measurement of the "skew" as to these compared signal events.

Thus, when a complex computer system, or I/O controller, or interface unit, or other type of digital module is built, it is necessary to know the conditions of each of the various clocks and their relationships to one another in order that proper system operation may be effectuated. In order to do this, it is necessary to know the condition of each of the various pulse widths of the clocks in the system, and it is also necessary to know how each of these pulse widths relate to one another, which information can be garnered by measuring the "skew" in a comparison between the same type of signal events as between the two signals being compared.

Heretofore, the common procedure was conducted by manually verifying each parameter of each clock with an oscilloscope where it was necessary for an operator to locate and isolate the signal and connect it to an oscilloscope so it could be observed. Considerable amounts of time and work effort were required to do this. For example, in one type of Burroughs computer system designated as the "A3 Series", there were some 23 clocks involved in the system which it was required to check for proper conformance to specifications. In this situation, it was required that a technicican or operator verify each individual clock signal and this could consume inordinate periods of time, sometimes more than an hour or two.

Additionally, since the measurements were based on the individual's perception and interpretation of the oscilloscope display, the test procedure was subjected to an individual or personal error level if the technician misperceived or misread the oscilloscope signals.

Thus the provision of an automated circuit apparatus was provided in order to eliminate the long time delay testing factor and to eliminate any possibility of individual perception errors.

SUMMARY OF THE INVENTION

The present tester and verification apparatus operates to verify the frequency of all of the system clocks and also to verify the "delay skew" between each clock and every one of the other clocks to see whether they remain within the required specifications, or else to notify the operator if there is an out-of-specification error. Additionally, the tester measures the pulse widths of all the "asymmetrical" clocks and operates to notify the operator if there is an error or out-of-specification relationship.

This is accomplished by use of a multiplexer which selects each clock signal, in sequence, and passes the clock signal to one input of a register circuit. A mode multiplexer receives two inputs whereby a reference clock input signal can be used to compare the selected clock signal from the clock multiplexer. The mode multiplexer can act in a (i) pulse-width mode, or (ii) a skew mode. The output of the mode multiplexer is passed through a programmable delay line circuit which is adjusted by a microprocessor which uses a programmable interval timer to measure the clock frequency.

The microprocessor reads the output of the result register circuit by first setting the delay line circuit to a specified minimum delay which is equal to the minimum pulse width. Then the microprocessor sets the delay line circuit to the maximum specified pulse width. By reading the output of the result register circuit, the microprocessor can determine if the clock pulse width is greater than the minimum while also being less than the maximum. If this does not occur, an error signal can be activated to tell the operator.

The skew measurement mode, the mode multiplexer, is set by the microprocessor so as to use the same type of minimum-maximum algorithm to determine the clock skew which can be read from the output of the result register and fed to the microprocessor for evaluation. This is accomplished by comparing the event times between the 1–0 transition between one selected system clock and another selected system clock.

BRIEF DESCRIPTION OF THE DRAWINGS

FIG. 2 is a timing diagram showing the pulse width measurement mode in operation in order to measure the pulse width of a selected clock signal;

FIG. 3 is a timing diagram of the skew measurement mode whereby a selected input clock signal can be compared with any other selected clock signal in order to determine the skew relationship between the two signals to see whether they meet the proper system specifications.

DESCRIPTION OF PREFERRED EMBODIMENT

Figure 1:
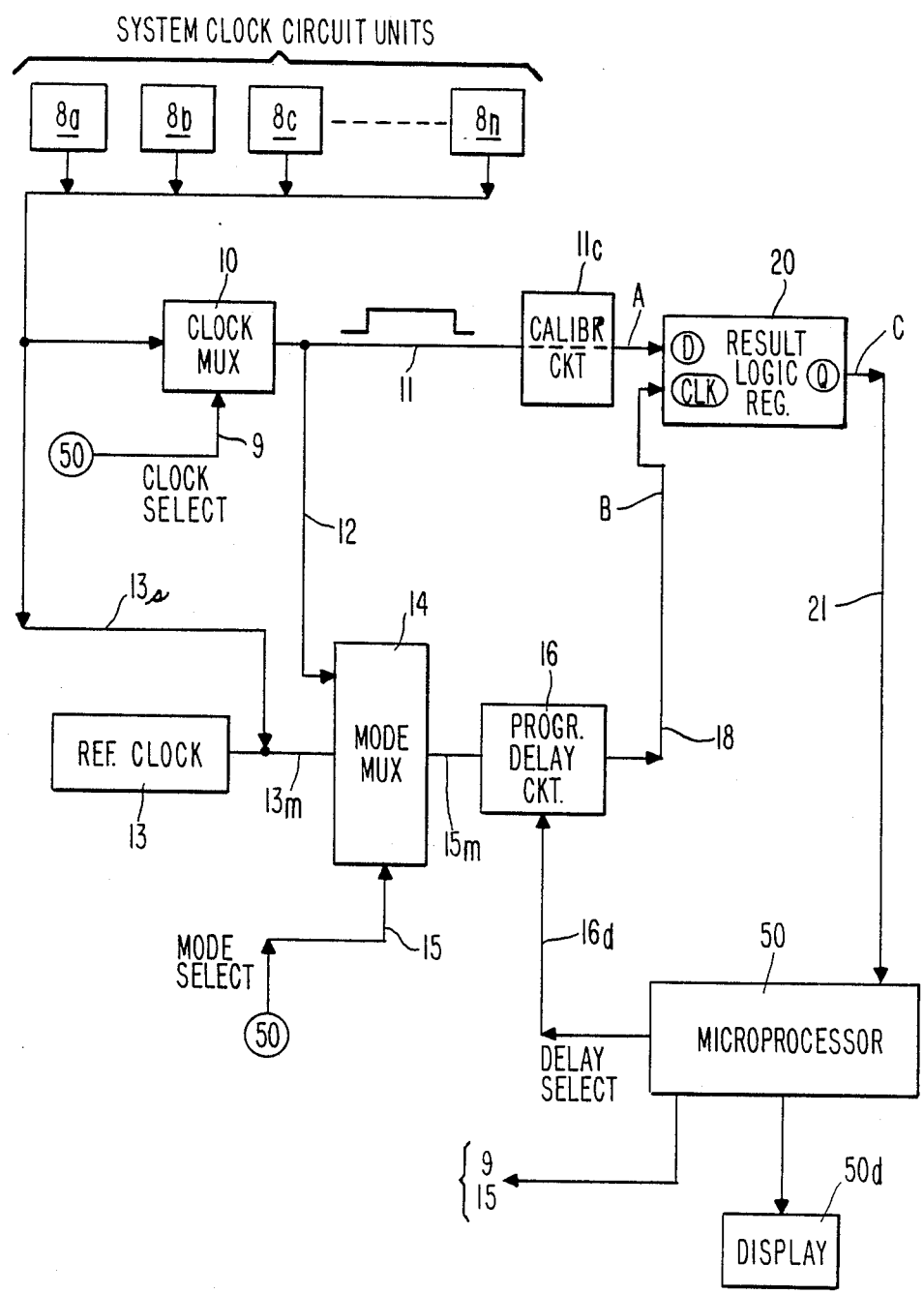
FIG. 1 is a block diagram showing the tester apparatus for providing the pulse width/skew measurements for evaluation by a microprocessor.

The disclosed automated testing apparatus presented herein is set to perform the following tasks:

(1) to verify the frequency of all of the system clocks involved;

(2) to verify the "delay skew" between each clock and every one of the other clocks in the system; then to notify the operator if an outness has occurred;

(3) to measure the pulse widths of all the "asymmetrical" clocks and notify the operator if there is an outness involved;

(4) to determine that all skew and all pulse-width measurements are accurate between the parameters of 500 picoseconds and one nanosecond;

(5) to reduce the overall time required for testing and to minimize operational errors.

In the prior cited example of a Burroughs A3 computer system where there were some 23 separate and different clock signals involved, it may be seen that this could constitute a formidable task to test and measure each of these clock signals. For example, these signals may be divided into eleven main groups of clocks and four subgroups of clocks. The frequencies involved in this particular example might be: 8 megahertz, 4 megahertz, 31 kilohertz, and 2 kilohertz. Then as between each of these groups, the skew requirement between each of the groups mentioned hereinunder might be as follows:

(a) group 1: 3.1 nanoseconds (maximum skew)
(b) group 2: 5.0 nanoseconds (maximum skew)
(c) group 3: 10.1 nanoseconds (maximum skew)
(d) group 4: 9 nanoseconds (maximum skew)

Then additionally, the skew requirements between each of the above groups might be specified as follows:

(e) between group 2 and group 1—a maximum of 9 nanoseconds skew
(f) between group 3 and group 4—a maximum skew of 23 nanoseconds.

Then in regard to the pulse-width requirements for the asymmetrical clocks, the specifications might require the following:

(g) a pulse-width time in the positive direction (0–1 transition) which will be from 25 nanoseconds minimum up to 35 nanoseconds maximum.

In the particular example at hand regarding the A3 computer system, certain assumptions have been made about the clock distribution board which were used to minimize the design time and to reduce the hardware used to implement the design. For example, these assumptions were:

(1) to use just "one clock" from each group to measure the clock skew between each other group. Since the clocks within a given group will be found to emanate from the same chip, and further since the gate-to-gate delay on the same chip is 20% of the maximum delay, then it could be assumed that the maximum error should be:

$0.2 \times 2.5 \times 10(-9)$ which will be found to yield a worst case error (assuming accuracy of 500 picoseconds) which is equal to less than half of the targeted accuracy of one nanosecond.

(2) a further part of the assumption was not to measure the pulse width of the "symmetrical" clocks. Since the symmetrical clock has equal high and low periods, and assuming if the frequency is correct, then the high time would also have to be correct. Thus, theoretically measuring the pulse width of the symmetrical clocks would not particularly indicate any viable information.

Referring to FIG. 1, there is shown a schematic block diagram of the tester system apparatus. The system is controlled by a microprocessor 50 which controls the mode multiplexer 14 in order to select (a) the pulse width mode or (b) the skew mode. The microprocessor 50 also controls the delay circuit 16 and the clock multiplexer 10 in order that the clock multiplexer 10 can select a particular clock for connection to the multiplexer 10 so that the clock signals from a selected clock unit can be tested.

As seen in FIG. 1, a series of different clock units appear in the digital system to be tested. These different clock units are designated as $8_a$, $8_b$, $8_c$, . . . $8_n$. The outputs of any selected one of these clocks feed into the clock multiplexer 10. Actually, each of the 23 clocks, for example, are fed into the clock multiplexer 10 but the clock select line 9 of multiplexer 10 (which comes from the microprocessor 50) is used to select an individual one of the incoming clock signals, so that this clock signal can be analyzed either as to its pulse width or as to its skew relationship to other clock signals.

As seen in FIG. 1, the clock multiplexer 10 has two output lines 11 and 12. The line 11 is fed over to the result register circuit 20 to provide an input to terminal D. The result logic register circuit 20 has one input terminal indicated as D and a second input terminal marked CLK. The output terminal is marked Q. The line 11 is often designated as "Signal A" in FIGS. 2 and 3. Likewise, the clock input line to the result register 20 on line 18 is designated as the input "Signal "B".

The output line 12 from clock multiplexer 10 presents the same signal as that on line 11, and is fed to the mode multiplexer 14. Additionally there is another input to the mode multiplexer 14 which comes in one line $13_m$ from the reference clock 13. A third input line 15 is the "mode" select line by which the microprocessor 50 selects the mode operation of the multiplexer 14.

The output line $15_m$ comes from the multiplexer 14 over to the delay circuit 16. The delay circuit 16 is a programmable delay line circuit which is regulated by the microprocessor 50. The microprocessor 50 sends control signals on line $16_d$ to the programmable delay line 16 in order to set the delay line to the minimum delay (which is equal to the minimum allowable pulse width) as will be explained in FIG. 2. Subsequently, the microprocessor 50 causes the programmable delay line circuit to increase the delay in incremental steps until such time as it is determined whether or not the pulse being tested is in-tolerance or out-of-tolerance.

Thus the selection of the amount of delay time which is provided by the programmable delay line circuit is subject to control from the microprocessor 50 which can provide incremental amounts of delay time which then can be checked through use of the result register circuit 20.

The microprocessor 50 uses a programmable interval timer in order to measure the clock frequency. This is accomplished as a result of the output signal level on line 21 received from the result register circuit 20 on the output signal designated as "Signal C". This signal "C" is also shown on FIGS. 2 and 3.

The type of logic known as ECL (Emitter Coupled Logic), is used to measure the pulse widths and the skew relationships. The ECL logic system is chosen to provide its high speed which can enable a resolution up to one nanosecond; additionally, the ECL logic is valuable because of its virtual immunity to voltage and temperature variations so that the measurement technique can provide long term repeatability and accuracy.

FUNCTIONAL OPERATION

In the example using the A3 system computer for illustrative purposes, this A3 system has a clock distribution card which resides on a printed circuit card called the PIC or Processor Interface Card. The clock distribution card uses an external 16 megahertz time base clock in order to generate the various system clocks $8_a, 8_b \ldots 8_n$. This external clock is generated onto the clock measurement tester apparatus so that both the tester apparatus and the clocks on the PIC card will run synchronously with each other.

Taking, for example, the operation for the testing of "pulse width measurement", there is necessity for a technique to measure the "pulse width" of an asymmetrical clock's pulse width under conditions which do not require a reference clock to perform the measurement. The system operates so that the asymmetrical clock itself determines its own pulse width. The considerable advantage of doing this is that no reference clock is needed for this operation which means that the measurement hardware is inherently "self-synchronizing".

The clock multiplexer 10 (for pulse width measurement operations) selects the particular clock to be measured ($8_a, 8_b \ldots 8_n$). The mode multiplexer 14 determines which measurement mode it will operate on.

If the mode multiplexer 14 is in the "pulse width mode", the clock signal on line 11 from the clock select multiplexer 10 will also be fed over to the programmable delay line 16.

If the mode multiplexer 14 is in the "skew mode", then the reference clock 13 is routed over to the programmable delay line circuit 16. The programmable delay line circuit 16 operates to delay the incoming pulse for a programmed delay which is set by the microprocessor 50.

The output of the programmable delay line circuit 16 is fed on line 18 to the input terminal marked CLK on the result register circuit 20. This line is designated as signal line B in FIG. 1 and also in FIGS. 2 and 3.

The result register circuit 20, in turn, captures the logic state of the clock on the D input (from signal A) of the result register 20.

The microprocessor 50 reads the output (signal C) of the result register and determines if the pulse is the correct value by making two pass-cycles at it.

First, the microprocessor 50 sets the programmable delay line 16 to the specified "minimum" delay which is equal to the minimum pulse width specified by the design specifications. The discussion of FIG. 2 hereinafter will illustrate this action.

If the pulse width is "greater" than the specified minimum value of pulse width, then the Q output of result register circuit 20 will provide the signal C which will be at a logic one (1), indicating an acceptable condition.

Subsequently, the microprocessor 50 sets the delay line circuit 16 to the "maximum" specified pulse width. Now, if the clock pulse width is "less" than the specified maximum value, then the Q output of signal C which is output from the result register circuit 20, will be at the logic zero (0), again indicating an acceptable result.

Thus if both these tests,—that is, the minimum test and the maximum test, are passed according to the appropriate logic level of signal C, then the tester knows that the pulse width of the clock under test is greater than the minimum value, and less than the maximum value, and has passed the test.

This provides for a fast production environment type of test known as a Go-no Go test which will determine if the clock pulse width is within the specified range.

The "exact value" (plus or minus 0.5 nanoseconds) of the pulse width can be determined via the microprocessor 50 by going through the procedure of initially setting the delay time to zero and then incrementing that delay time until the output of the result register changes from the acceptable "one" logic over to a logic zero value which indicates that at that moment the pulse width is out of the proper specification value.

As previously discussed in the illustrated example, it was desired to test and check the skew requirements between, for example, the clocks of group 2 and group 1, which should rest within the realm of nine nanoseconds maximum. Likewise, it was desired to test and check the skew relationship between the clocks of group 3 and group 4 which were to have a skew-maximum of 23 nanoseconds.

In the skew measurement, there is required a reference clock which is shown in FIG. 1 as item 13. This reference clock is chosen as the "earliest" occurring clock in the system and does not have to be an external clock. By choosing the earliest clock in the group, this clock can be designated as the first-run clock or FRUN clock. Thus the first-run clock is used as the source of the reference clock 13 in FIG. 1.

In the skew measurement operation, the first-run clock 13 is the source of the basic reference pulses on line $13_m$ which is input to the mode multiplexer 14. The mode multiplexer 14, at this period of time, has been set through the mode select line 15 by the microprocessor 50 to operate in the "skew mode". Thus the reference clock will be seen to propagate its "reference" clock signal to the CLK input (via signal B) of the result register circuit 20. Then at the same time, the particular clock under measurement (such as $8_a, 8_b$) is seen to propagate its signal A over to the D input of the result register circuit 20.

During this time, the microprocessor 50 will operate on the same type of algorithm that was used in the prior pulse width measurements, that is to say,—the microprocessor 50 will set the delay line circuit 16 to a minimum delay period and read out the signal C from the Q output of result register 20. After this, the delay circuit 16 would be set to the maximum delay period and a read-out of signal C would be made by microprocessor 50.

Or alternatively, the microprocessor 50 can set the delay in the delay circuit 16 at a level of "zero" and then increment that delay in subsequent cycles until the output of the result register 20 is equal to a logic "zero"-which indicates the exact value of the skew.

The tester apparatus of the present disclosure may be designated as an "automated pulse width/skew value verifier" unit. This automated verifier unit has proved to be accurate to within 500 picoseconds of the actual reading. By identifying all the sources of error in the system and by compensating for them with the programmable delay line circuit 16, it was possible to achieve this level of accuracy.

This was possible since the source of any error conditions was constant, then it was possible to null these factors out of the system.

Accordingly, by the use of this automated tester-verifier, it was possible to accomplish the system clock time testing from the previously required periods of one hour or more down to less than several seconds in addition to allowing that the readouts and the timing measurements would be consistently repeatable.

With reference to FIG. 2, there is seen a series of operations which are used for testing and verification using the pulse width measurement mode. For example, a selected one of the clock sources such as $8_a$, $8_b$, etc. is selected and fed as input to the clock multiplexer 10. This particular selection is done through the clock select signal 9 which can select one of the multiple input lines from the clocks. The output pulse from the clock multiplexer 10 is fed on line 11 to form signal A which is fed to the input D of the result register circuit 20.

Referring to FIG. 2, there is seen the positive pulse signal of the clock whose pulse width is desired to be tested. Subsequently the reference clock 13 conveys the reference clock pulse shown as signal B which is provided to the clock input of result register circuit 20. The reference clock signal B is set by the microprocessor 50 through the delay circuit 16 to provide the minimum pulse width which is shown in FIG. 2 by means of the clock signal B.

Now the result register 20 captures the logic state of the signal A by putting out a logic signal C. Thus the time period shown on FIG. 2 as $t_d$ represents the difference between the 0–1 transition of the signal A and the 0–1 transition of the signal B. This will be reflected by the signal C which will go from 0–1 at the moment that the signal B has its rising 0–1 transition.

Thus if the pulse width of signal A is greater than the specified minimum pulse width developed by signal B, then the Q output of signal C will be set to a logic "one". The next sequence involves the cycle where the microprocessor 50 sets the delay line circuit 16 to the "maximum specified pulse width" as will be seen in FIG. 2 by the signal B-2. Now if the clock pulse width is "less" than the specified maximum, the Q output of signal C-2 will result in a logic "zero" to indicate that the signal A pulse, which was the pulse to be tested, is now lesser than the maximum pulse width and is greater than the minimum pulse width as was shown in the signal B and the signal C.

Thus, as seen by the output signal C-2 of FIG. 2, this output line has gone from a logic one into a logic zero condition which tells the microprocessor 50 that the measured clock pulse signal A is less than the specified maximum and thus meets the proper specification value.

Referring to FIG. 3 which illustrates the "skew measurement" mode, this situation occurs when the mode multiplexer 14 is controlled by the mode select line 15 from microprocessor 50 in order to put the multiplexer 14 into the skew mode.

As seen in FIG. 3, the clock multiplexer 10 with its clock select line 9 will select a particular one of the clocks $8_a$, $8_b$, etc. The output of the selected clock is fed on line 11 over to the input D of the result register 20 and represents the signal A as shown in FIG. 3.

And coincidentally, the reference clock block 13 is connected to the clock signal from another group of system clocks in order to determine the relationship between the pulses of the selected clock $8_a$ and the pulses of another group clock such as $8_m$ which is used to act as reference clock 13.

Thus the result register receives the signal A input from the selected clock of the first group and this is shown as signal A in FIG. 3. Then subsequently, the result register 20 receives the "reference signal" from the other group clock which is fed through the mode multiplexer 14 and the delay circuit 16 to form the signal B of FIG. 3. At this juncture, the microprocessor 50 has provided a delay time in the delay circuit 16 so that the signal B is delayed beyond the arrival time of signal A. In FIG. 3, the period $t_{ms}$ indicates the minimum skew permissible between the signals A and B.

It will be noted here that the trailing edge of signal A is being used for test rather than the leading edge. However, either the leading edge or trailing edge could be used since when it is known that the pulse width is acceptable, then only one edge is needed for the skew test.

Since the signal B in FIG. 3 will turn on the signal C into the logic "one" state, at the outset of the signal B pulse, this means that the result register 20 has indicated that the skew between signal A (trailing edge) and signal B is greater than the minimum allowable amount of skew, it thus fits into the proper specification.

As seen in FIG. 3, the signal B-3 shows that the microprocessor 50 has provided a delay pulse through circuit 16 which will indicate the maximum skewed time period which is permissible. This is shown as a time period $t_{max}$.

Now it is seen that the signal A has a descending transition from 1-0 which at that point in time $t_e$ correlates to the low logic side (equal zero) of the signal B-3. Thus no change has yet occurred in signal C-3.

Now at the end of the maximum skew period, the rising pulse on signal B-3 will be seen causing the output signal C-3 to return from logic one to logic zero, and the logic zero is read by the microprocessor 50 as indicating that the skew relationship to signal A is less than the maximum permissible skew period allowed and thus is suitably within the specifications required.

It should be understood that the present system involves first the checking or testing of the pulse width of a given clock signal, and then subsequently checking the skew relationship of that clock signal whereby a clock signal from one group of clocks is checked against the clock signal of another group of clocks in order to see whether the skew relationship is within the desired parameters of the specification for that particular system.

Additionally, it should be noted that not only is the testing provided for the pulse width and for the skew relationship but also the system can measure the actual time period of the pulse width and provide a read-out to a video monitor, which read-out will be accurate to within plus or minus 500 picoseconds.

It should be observed in this tester-verification apparatus that before any testing is initiated, there is a calibration procedure which is used to null out any inherent errors residing in the system. This is provided by the calibration Null-Delay Circuit $11_c$ which is shown in FIG. 1. This system operates by setting the programmable delay line circuit 16 to a delay of "zero" so that the incoming clock signals such as clock $8_a$ is conveyed along line 11 through the calibration Null-Delay Circuit $11_c$ and over, as signal A, into the input D of the result register 20.

Likewise, the same clock signal $8_a$ which is output from the clock multiplexer 10 is also conveyed on another channel through line 12 over to the mode multiplexer 14 which has been set into the "pulse width mode". Then the signal from line 12 is passed on through line $15_m$ through the programmable delay line circuit 16, which has been set to a zero delay period by the microprocessor 50. This results in the original clock signal $8_a$ now being conveyed on line 18 as signal B and put into the "clock input" of the result register circuit 20.

When this is done, the calibration null-delay circuit $11_c$ is adjusted to insure that the rising pulse of the clock signal $8_a$ will arrive at exactly the same time as the "clock input" of result register circuit 20 as the rising pulse signal A arrives at input D to the result register 20. When this is done, there is now provided a certainty that any inherent delays from the input to the clock multiplexer 10 over to the input D—will be exactly the same as any inherent delays from the input signal (to the clock multiplexer 10 which goes through the line 12, multiplexer 14, line $15_m$, the delay line circuit 16 and the line 18) to the "input clock" of the result register 20.

Consequently, with the nulling out of the inherent delays in the circuitry, it is then possible to proceed with the pulse width testing mode and subsequently with the skew testing mode.

The recognition as to the proper point of calibration, when the delay period is adjusted in the calibration null-delay circuit $11_c$, is accomplished by the sensing by the microprocessor 50 of the signal C on line 21. When both the positive transition of the clock signal arrives at the input point D and the exact transition from zero to one from the clock $8_a$ arrives at the input point designated CLK, this means that the output signal C will be a logic "one" signal so that the microprocessor can then sense when the signal C has changed from logic zero to logic one and it will know at that point the signals A and B had their positive 0-1 transitions arrive at the same moment.

In the drawing of FIG. 1, the various clock signals are seen designated as $8_a$, $8_b$, . . . $8_n$. For example, if these represented eight different system clocks, the microprocessor would select first one of these for pulse width testing after which it would select the second system clock such as $8_b$ for pulse width testing.

After microprocessor 50 has gone through the sequence of testing and actually measuring the pulse width of each of the system clocks $8_a$ through $8_n$ and stored this information in its local memory, the microprocessor 50 could then go into the execution of a routine which would provide for skew testing between different groups of system clocks.

Thus referring to FIG. 1, it will be seen that each group of system clocks such as $8_a$ is connected by a dotted line $13_s$ to the output side of the reference clock circuit 13 in order to provide a signal on the line $13_m$. Then, for example, system clock $8_c$ could be selected for input to the clock multiplexer 10 so that the system clock $8_c$ could now be checked against the system clock $8_a$ which was fed into line $13_m$. At this time, the microprocessor has reset the mode multiplexer 14 into the "skew mode".

Now since the tester has already checked the pulse width during the phase known as the "pulse width mode" and the microprocessor knows what the actual value of the pulse width is for each of the system clocks, the skew testing can occur merely by checking out one edge of the system clock. This could be either the rising edge or the trailing edge. In this case, the system will operate to compare the trailing edge of the selected "reference clock" such as $8_a$ which is to be measured against the input clock, such as $8_c$. Generally, in the skew analysis mode, the reference clock is generally chosen to be that particular system clock which has the earliest starting time. This particular system clock is called the "FRUN" which represents the "first run or first running clock" in the group. In this example, $8_a$ is chosen as the FRUN system clock.

In the ideal situation, each of the system clocks would have their state transitions occurring at exactly the same moment and there would be no need to worry about variations in these transitions. However, under actual operating conditions, it is understood that these state transitions in the various system clocks will not occur at the same simultaneous moment and must be given minor variations in time periods for the state transitions, but that these time periods must fall within certain specified time periods.

Thus it is essential when doing the "skew analysis" that the particularly chosen transition event fall within a certain "window" of time and it is needful to be assured that this particular transition event will fall within the window of time specified by the tester system. Thus the system tester operates to provide a reference transition of the "minimum time" allowable so that the transition of the signal under test must occur after the minimum time period allowed.

Likewise, the skew analysis must provide a "maximum time" reference to verify that the transition point of the signal under test will occur before that maximum period of time.

Consequently, the skew mode operates to select the falling edge of the FRUN reference signal as a reference point. Since this signal is to be used as a first test, to provide the minimum skew of say 2.5 nanoseconds, then the programmable delay circuit 16 is set to 2.5 nanoseconds so that the trailing edge of the FRUN signal will provide its transition point as signal B to the clock input $2\frac{1}{2}$ nanoseconds after it has been received on the line $15_m$. This is seen in FIG. 3 as the minimum skew time $t_{ms}$. Thus since the signal A is in its positive transition and has not yet gone into its 1-0 falling transition event, this indicates that the trailing edge of the signal A or signal under test does meet the minimum skew window.

Likewise and subsequently, the microprocessor 50 will provide a programmed delay into circuit 16 of the "maximum" skew window which, for example, could be 9 nanoseconds. Thus, as seen in FIG. 3, microprocessor 50 will set the delay circuit 16 so that the time period designated as $t_{max}$ is equal to 9 nanoseconds; and as seen in FIG. 3, since the signal A has already completed its trailing edge transition from 1–0, then at the subsequent pulse (after $t_{max}$) as seen in line B3, the "skew sensing" pulse being a logic one and the signal A, at that time being a logic zero, will result in the output signal C3 having a logic zero output which will indicate that the signal A transition from 1–0 was within the window of the maximum side of the skew.

Thus, by operating to provide a first pulse at signal B to give the minimum skew side of the window designated $t_{ms}$ and then providing another pulse signal B-3 to provide the maximum side of the window designated as $t_{max}$, then by insuring that the trailing edge of the signal A, of FIG. 3, falls in that window, it can be assured that the skew relationship between the two groups of system clocks will meet the proper skew specification.

Since the system has already determined that the pulse width of the signal A is within the proper time specification, then it was only necessary to check the trailing edge of that input signal to make sure that the skew characteristics are sufficiently accurate.

In regard to the "pulse width mode" for checking the pulse width of a system clock in order to see that it meets certain desired parameters, it will be seen that there is no "reference clock" really needed in that, in the pulse width mode, the system clock to be tested is split into two channels and the two channels are fed to the result register circuit. However, one of the channels is provided with a programmed delay as will be seen in FIG. 2 whereby the signal B is provided with a delay time $t_d$. This is the minimum pulse width permissible delay. Thus the leading edge of the signal A must occur within the time period $t_d$ of the leading edge ("capture" edge) of the delayed pulse signal B.

Since the leading edge of signal A has occurred within the minimum pulse time period,—say, for example, 25 nanoseconds, then the signal C will provide a logic "one" output which can be read by the microprocessor to indicate that the leading edge of signal B is properly within specification.

Subsequently, the microprocessor 50 will cause a delay pulse which is seen in the signal line B-2 of FIG. 2. Here the maximum pulse width delay time is shown as $t_{dmax}$ which, for example, may be 35 nanoseconds. Thus the rising (leading) edge or captture point has been delayed by 35 nanoseconds. Now, by looking at signal A which is at the logic low point (=0) at this time, and looking at the signal B-2 which has just risen to its logic "one" high point, it is seen that the output signal C-2 has provided a logic zero output signal which is read by the microprocessor 50 and which indicates that the trailing edge of the signal A has terminated before the maximum delay time, thus insuring that it falls within the desired parameters.

A feature of the present system involves the fact that the system, as organized, not only will check the parameters for pulse width and for skew but will also operate to actually determine the actual value of the pulse width so that the system is also a "pulse-width measuring unit".

This is accomplished where the microprocessor will start a sequence of actions for programming the delay line circuit 16 where the first cycle will be a zero delay period, then the next cycle will be an incremented period of 500 picoseconds, followed by a new cycle which is further incremented by 500 picoseconds and then a new cycle which is incremented by 500 picoseconds. This series of delay times will occur, thus each time providing a new signal B which has an incremented delay time. Thus the microprocessor 50, by reading the output signal C, can tell when the signal B has been coincident with the leading edge of the system clock on signal A and subsequently when the delayed pulse is coincident with the trailing edge of the system clock on signal A. Thus the microprocessor can calculate the difference between the first time that signal C provides a logic one and the second time that the signal C provides a logic one and calculate the difference in time between these two logic "one" signals (first and second) in order to determine the actual value of the pulse width period involved.

Quite differently from the type of testers known in the prior art which merely detect "relative" skew whereby the skew is made relative to a reference signal, the present system provides for a greater level of accuracy in that in the older systems the reference signal could be out of specification and still pass its test as long as the compare signal was out of specification by the same amount. This would imply that certain design errors could go undetected.

The present circuit configuration is not a "relative skew comparator" system, but rather involves a microcomputer-based skew verifier and measurement tool. Hence, if the magnitude of the skew is known, it can be verified. On the other hand, if the magnitude of the skew is not known, it can be programmatically learned or measured under software control of the microprocessor.

Thus by means of the test system, the board timing specifications can be verified or learned by use of the automated tester apparatus. Thus the system provides for skew testing and verification on an internal absolute basis rather than on a reference comparator which itself may be out of specification.

In regard to the pulse width circuitry of the prior art systems, they also detected only a relative difference in time which was based against a reference clock which itself may have already been out of specification. Again it might be reiterated that the present automated tester system does not need a "reference" to measure the pulse width of a clock. It is unique to the present system that it uses the clock under measurement to measure itself. This is a very advantageous feature which eliminates the need for an external reference and makes the measurement technique self-synchronizing as well as self-clocking. This approach allows the user to verify that the pulse width is not only within the specifications required, but it can also actually instruct the microcomputer to measure the pulse width and display it on a cathode ray tube.

There has been described herein an automated tester-verifier system for providing rapid and accurate testing of the many types of pulse widths and skew relationships involved in a digital system. The system has proved to be relatively simple to construct and to operate very rapidly with extreme accuracy which is repeatable to verify the conditions of operation to be within the required specifications of the digital system.

While the above system has been described in its preferred embodiment, there may be other variations which operate within the confines of the concepts of the system described and which fall within the scope of the following claims.

What is claimed is:

1. An automated tester-verifier apparatus for selectively testing the pulsewidth of each one of a plurality of system clocks in a digital system comprising:
   (a) selection means for selecting a designated clock signal from a plurality of separate clock signals;
   (b) first and second channel means for respectively transmitting said designated clock signal, on said first channel means, directly to a result logic register means and, on said second channel means, via a programmable delay circuit means to said result logic register means;
   (c) microprocessor means for controlling said delay circuit means and for initially delaying said clock signal in said second channel means for a period, $t_a$, representing the minimum allowable pulse width, and secondarily for a period, $t_x$, representing the maximum allowable pulse width of said designated clock signal;
   (d) said result logic register means for logically signaling, to said microprocessor means, whether said designated clock signals fall within said $t_a$ and $t_x$ time periods.

2. The apparatus of claim 1 wherein said microprocessor means includes:
   (a) means to institute a series of cycles which provide an initial zero delay time period then a series of delay periods which are each incremented by 500 picoseconds for enabling said result logic register to sense the rising edge and the falling edge of said designated clock signal;
   (b) means to compute the actual value of the pulse width of said clock $t_d$ within 500 picoseconds.

3. The apparatus of claim 2 which includes:
   (a) display means connected to said microprocessor means for displaying said value of said pulse width.

4. The apparatus of claim 1 which includes:
   (a) calibration circuit means in said first channel means for nulling out any inherent circuit noise;
   (b) means in said microprocessor means for setting up a zero delay in said delay circuit to permit adjustment of said calibration means.

5. An apparatus for selectively testing the pulse width of each one of a plurality of system clocks in a digital system comprising:
   (a) selection means for selecting a designated clock signal as a single source of signal clock information;
   (b) first channel means for transmitting said designated clock signal to the first input of a result logic register means;
   (c) second channel means for transmitting said designated clock signal to a second input of said result logic register means via a programmable delay circuit means;
   (d) microprocessor means for controlling and establishing a series of stepped delay time periods for delaying said clock signal in said second channel means and transmitting said clock signal, after said delay period, to a second input in said result logic register means.
   (e) said result logic register means for transmitting logical output signals to said microprocessor means to enable said microprocessor means to measure the actual value of the pulse width of said designated clock signal.

* * * * *